United States Patent [19]

Lamberts et al.

[11] B 3,984,242

[45] Oct. 5, 1976

[54] METHOD FOR FORMING A LENTICULAR ARRAY BY PHOTOGRAPHIC MEANS

[75] Inventors: Robert L. Lamberts, Penfield; Nelson R. Nail, Rochester, both of N.Y.

[73] Assignee: Eastman Kodak Company, Rochester, N.Y.

[22] Filed: Mar. 28, 1974

[21] Appl. No.: 455,759

[44] Published under the second Trial Voluntary Protest Program on February 24, 1976 as document No. B 455,759.

[52] U.S. Cl. .................................... 96/45; 96/27 E; 96/35; 96/41; 96/81; 96/116; 96/44

[51] Int. Cl.$^2$ ........................ G03F 5/00; G03C 5/00

[58] Field of Search ............... 96/116, 117, 118, 81, 96/44, 27 E, 41, 45; 350/162 R, 162 SF, 128; 354/101, 103

[56] References Cited

UNITED STATES PATENTS

| | | | |
|---|---|---|---|
| 2,794,739 | 6/1957 | Gretener | 96/81 |
| 3,425,770 | 2/1969 | Mueller et al. | 350/162 R |
| 3,582,329 | 6/1971 | Ivanov et al. | 96/35 |
| 3,592,529 | 7/1971 | Juhlin et al. | 350/162 R |
| 3,617,281 | 11/1971 | Lindin | 96/81 |
| 3,656,849 | 4/1972 | Lu | 96/27 H |
| 3,775,110 | 11/1973 | Bestenreiner et al. | 96/81 |

*Primary Examiner*—Edward C. Kimlin
*Attorney, Agent, or Firm*—John D. Husser

[57] ABSTRACT

An apparatus and method are disclosed by which a processed photosensitive material can be provided with a lenticular surface with each lenticule having a predetermined profile. The lenticules are arranged relative to one another with such a degree of accuracy that any speckle and scintillation that might be produced when the processed material is utilized as an element of a transmission or reflection type screen is reduced to a minimum, if not completely eliminated. Once the exposure factors for the emulsion have been established, the exposure profile can be determined for a particular lenticule profile to be imaged onto the photographic material or emulsion. The exposure profile can be utilized to provide a transparency master target pattern which can be of a relatively large size. After the master target has been exposed and developed or processed, the transparency is then placed in an optical system which minifies and projects the pattern on the target onto a photosensitive material in a predetermined and overlapping relation. After processing of the material, the lenticules are evident on the material which can then be used as an element of a rear or front projection type screen.

7 Claims, 8 Drawing Figures

FIG. 1
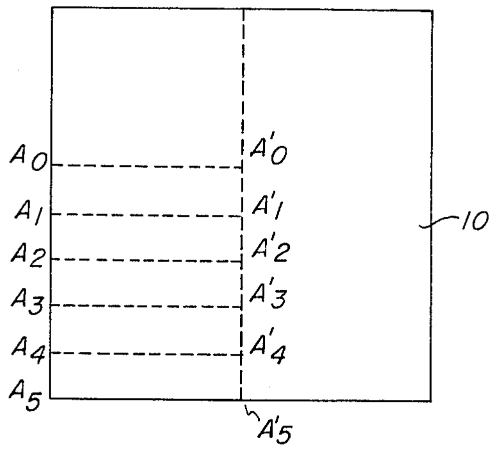
FIG. 5
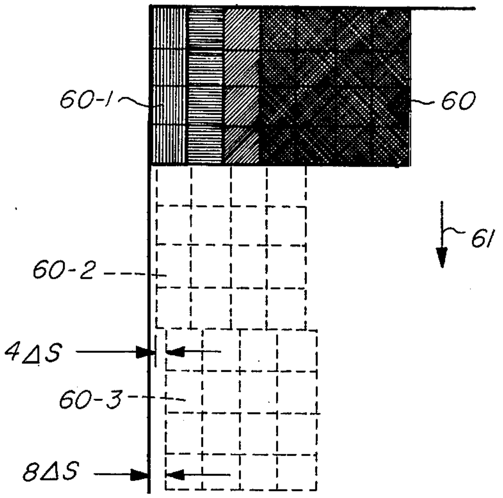
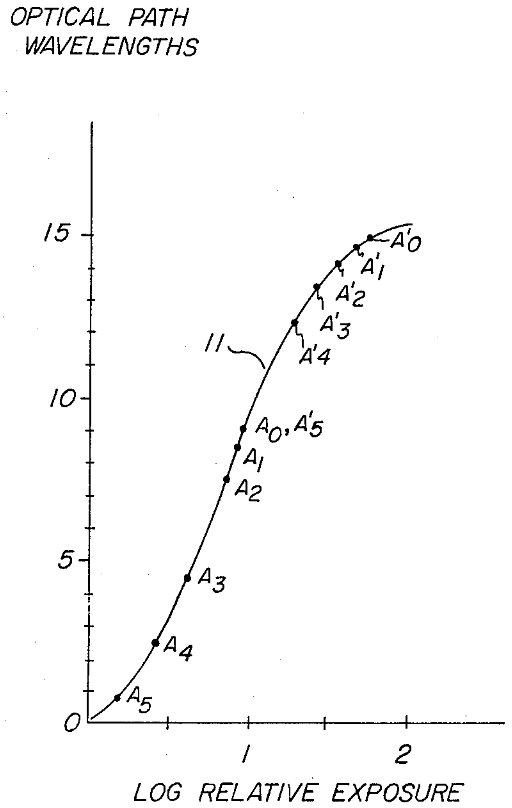
FIG. 2
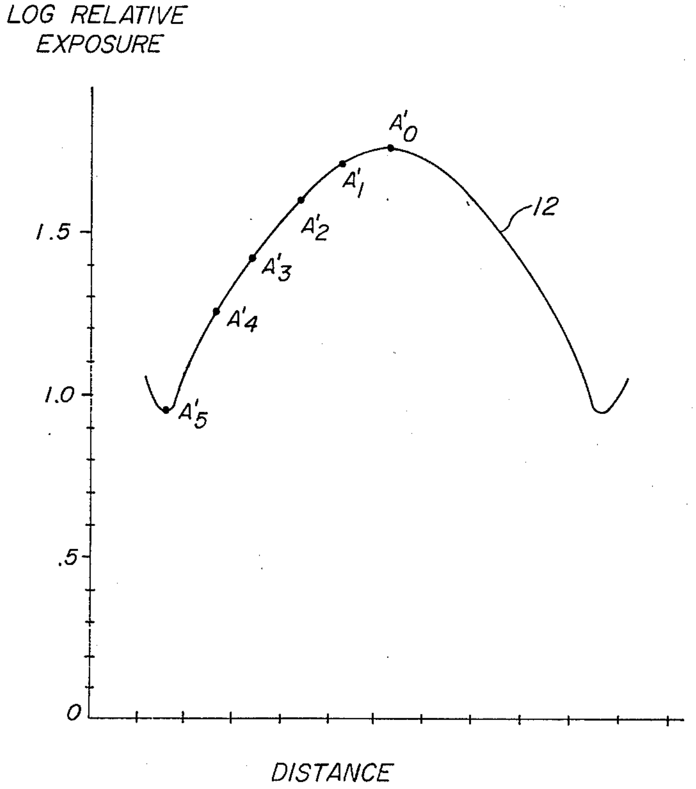
FIG. 3

FIG. 6
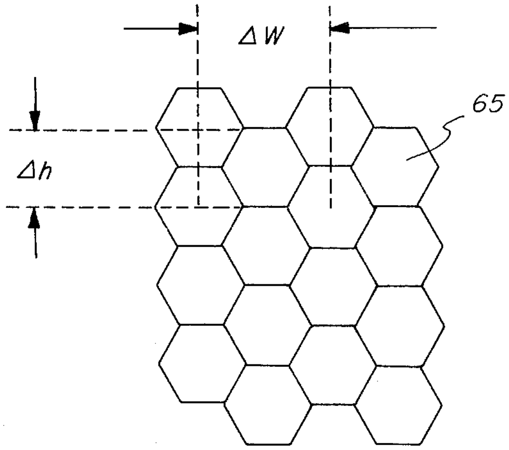
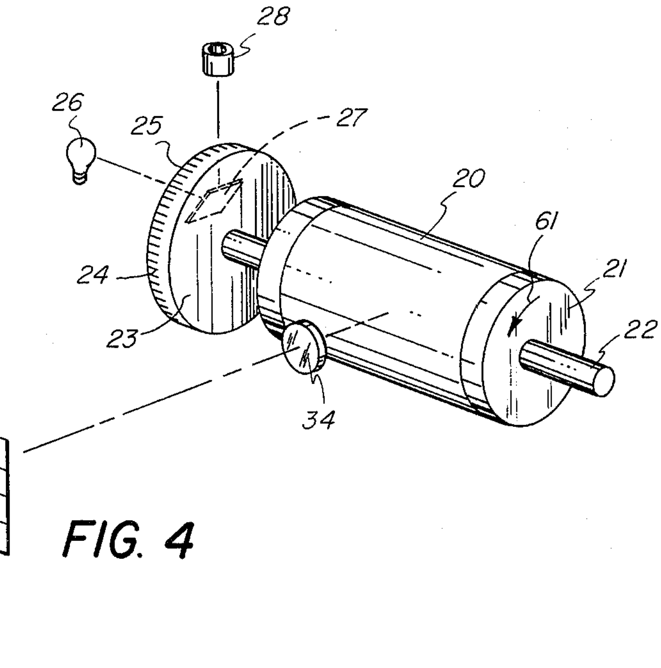
FIG. 4
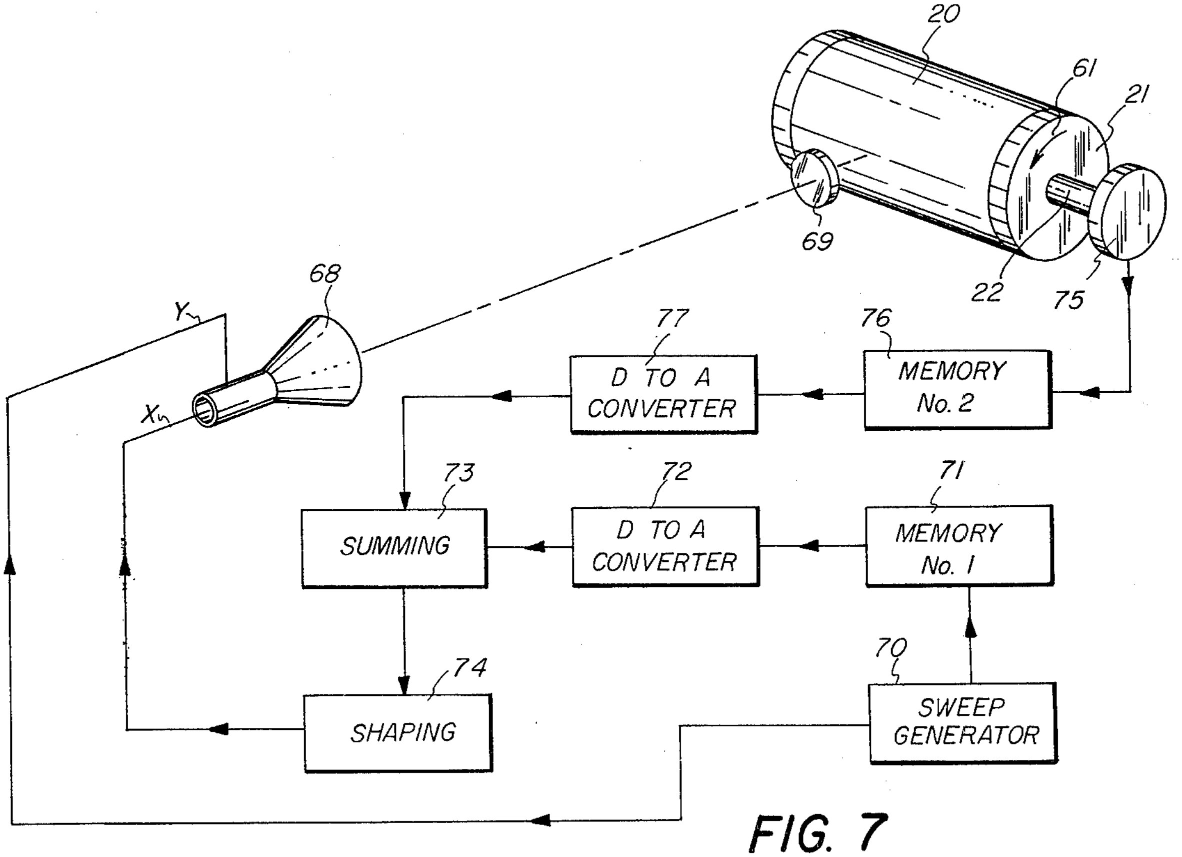
FIG. 7

METHOD FOR FORMING A LENTICULAR ARRAY BY PHOTOGRAPHIC MEANS

FIELD OF THE INVENTION

The invention relates to an apparatus and a method by which photographic techniques can be used to provide or produce on a surface of a transparent member an array of lenticules of a predetermined size and shape. More particularly, the invention relates to an apparatus and a method by which a lenticulated surface can be produced on at least one surface of a transparent member with much more uniform spacing of the lenticules, such a member being usable as an element of a photographic screen to greatly enhance the viewing properties thereof.

DESCRIPTION OF THE PRIOR ART

The prior art discloses many different screen structures directed to reducing scintillation, hot spot or diffusion of the light in various or different directions by a light image that is projected onto or transmitted through the screen structure. In most instances, such screen structures utilize multiple layers or lamina of transparent materials, each of which contains small optical elements of one form or another on one or both surfaces thereof. In the case of a reflecting-type screen, the reflecting property of the screen can be derived from small glass beads or cylinders adhesively secured to the surface of a support which faces the viewer or viewing audience. In a screen utilizing small cylindrical glass particles, these particles are distributed in a random manner on the support so that a diffuse scattering of the light incident on the surface is obtained. A known type of viewing screen of the transmission type includes a light-diffusing media which serves to distribute the light over a desired and relatively narrow angle in a vertical direction and to eliminate, or at least reduce, the moire interference patterns which would otherwise appear due to the relationship of the cylindrical lens pattern on one surface of a first element and the concentric rings formed by a Fresnel pattern on a second element. Both types of screens described herein above produced considerable scintillation. As a matter of fact, it is well known that both surface and volume light diffusers having a relatively small angle of light generally scintillate. Hence, the structures disclosed in the description above will scintillate because neither the Fresnel-type lens nor the cylindrical lenticulations will significantly reduce the ability of the image light to interfere.

Scintillation is caused by interference of the light in very small areas and appears to the observer as very small bright spots that usually vary in intensity and/or color with a changing image or a change in the observer's position. This occurs because of the random structure of the screen and the resulting addition of light amplitude in such small areas. On the other hand, a hot spot is usually an area in which the light as viewed from the observer's side of the screen falls off very rapidly from the viewing axis.

The use of one or more lenticular or lenticulated surfaces, that is, surfaces having a plurality of contiguous minute lenses or optical microelements has found advantages in many applications requiring controlled redistribution of radiant energy. Such lenticular surfaces have been found to be useful in high brightness, front and rear projection screens and in micro-imaging systems as well as in three dimensional and certain color systems. Existing techniques for producing such surfaces are primarily mechanical and are generally time consuming because of the size and accuracy with which the lenticules must be formed. As used herein, the term "lenticule" refers to minute optical elements which can be positive or negative spherical lenses, prismatic forms of optical elements, positive or negative cylindrical lenses, etc. In any case, the minute optical elements are generally of the same size and uniformly spaced. When the lenticules are made with such accuracy that adjacent lenticules are substantially the same in size and shape, the overall reflecting or transmitting characteristics of the screen become generally uniform from one lenticule to the next. As a result, any scintillation is reduced or substantially eliminated.

The use of photographic techniques for forming a lenticular screen or a lenticular surface on a photographic material is to be found in the art. For example, U.S. Pat. No. 2,182,993 to Moreno, and French Pat. No. 2,010,108 to Agfa-Gaevert AG disclose methods for making a screen utilizing photographic techniques. In the Moreno patent, an emulsion is exposed to a grating or grid and, after exposure, is developed and then subjected to a hardening process. A relief image is obtained comprising flat, planar surfaces interspaced by V-shaped grooves in a pattern corresponding to the negative of the grid exposed on the emulsion in the first step of the process. The formation of lenticules having a cross section or profile with a selected or predetermined curve is not possible with the Moreno process. Hence, the lenticules that are formed can only be prismatic in cross section and producible in a limited range of sizes. On the other hand, the French patent relates to making a master having a relief image which is accomplished by exposing the emulsion to a source of light that varies periodically in intensity. After processing and developing, a relief image is obtained comprising cylindrical lenticules. An "additive exposure" is also disclosed in the French patent and comprises passing the light through a grid to expose the emulsion, which is again exposed after the grid has been rotated through a predetermined angle. Upon processing, a lenticular screen is produced having spherical lenticules. If the two grids have unequal spatial frequencies, then a lenticular screen having toric lenses can be produced. However, neither of the aforementioned disclosures teach nor suggest any predetermined array of lenticules which will reduce or substantially eliminate scintillation and/or any hot spot in a screen.

SUMMARY OF THE INVENTION

One object of the invention is to provide an apparatus and a method by which relief images comprising lenticules can be produced photographically with each lenticule having generally the same predetermined relief profile.

Another object of the invention is to provide an apparatus and a method by which a transparent member having a plurality of lenticules of a predetermined size and of a predetermined profile can be produced photographically.

Yet another object of the invention is to provide an apparatus and a method by which a transparent photographic master target is produced which comprises at least one area in which a plurality of small exposure spots or areas were made, the spots being coordinately and contiguously arranged relative to one another for providing a minified image pattern that is subsequently projected onto a photosensitive material by successive and repetitive exposures of the master target in overlapping relation one to another so as to produce a lenticular surface upon processing thereof.

A still further object of the invention is to provide an apparatus and a method for photographically reproducing an array of lenticules which are of the same size and shape and each of which has a profile which is determined by exposure factors of the photosensitive emulsion in accordance with the relief image operating and spatial frequency response curves for the emulsion.

And yet another object of the invention is to provide an apparatus and method by which a processed photosensitive material can be provided with a lenticular surface with each lenticule having a predetermined profile, whereby the lenticules are arranged relative to one another with such a degree of accuracy that any speckle and scintillation that might be produced when the processed material is utilized as an element of a transmission or reflection type screen is reduced to a minimum, if not completely eliminated.

The objects set forth hereinabove with respect to the invention are obtained by an apparatus and method as described in more detail hereinafter. More particularly, the invention can be considered as an extension or an improvement of the system described in a copending application in the name of Robert L. Lamberts, Ser. No. 290,938, filed Sept. 21, 1972. Also, reference should be made to an article in the name of Robert L. Lamberts entitled "Characterization of a Bleached Photographic Material" published in Applied Optics, Vol. 11, page 33, January, 1972.

In the aforementioned application and publication, there are disclosures relating to the function and the use of "operating and frequency response curves" in practicing the invention disclosed therein. These curves which provide parameters needed to enable the calculation of a proper lenticular profile for exposure is unknown in the art and a first disclosure of such curves and of the use of such curves is made in the aforementioned application and publication. Without such curves, multiple exposures which produce a desired lenticule profile cannot be made without extensive trial and error exposures. The relief image operating curve is a plot of optical path, wavelengths versus log relative exposure, whereas the spatial frequency response curve is a plot of the (normalization factor)$^{-1}$ versus spatial frequency, cycles/mm. These curves express the exposure distribution for a photographic material or emulsion to produce, upon processing, a desired relief image. Hereinafter, the aforementioned curves are referred to as the "exposure factors" for a photographic material or emulsion.

Once the exposure factors have been established, the exposure profile can be determined for a particular lenticule profile to be imaged onto the photographic material or emulsion. Thus, by knowing the standard modulation transfer function and the sensitometric characteristics for a particular photographic material or emulsion, as well as the characteristics of the lens system to be used in imaging the predetermined lenticule profile onto the material, the exposure intensity for producing a photographic transparency to be imaged on the material can be readily calculated. In accordance with the invention, lenticules of predetermined optical power and size are formed photographically in the emulsion layer of a photographic film with exposure and processing as set forth in the aforementioned application and publication. The lenticules are not only substantially identical in accordance with the predetermined power and size but also very uniformly spaced.

The exposure factors for the lenticule material are first determined in accordance with the emulsion to be used and the sensitometric characteristics thereof. Such determination also requires that the shape or profile of the lenticule in various planes relative to the plane of the emulsion be established to provide a basis for the exposure that will produce the required profile for the lenticule. Once the exposure has been determined, it can be utilized to provide a transparency master target pattern which can be of a relatively large size. The target pattern will comprise a number of coordinately aligned, contiguous areas of substantially the same size and shape, a predetermined number of such areas forming a square representative of the lenticule size in the plane of the emulsion. The surface or profile of each lenticule will be determined by the respective exposure of each area comprising a lenticule and in accordance with the exposure factors for the emulsion and will be formed with processing of the emulsion. Generally, the array of areas on the target will be in the form of a square, such that the areas will form the equivalent of a 3 × 3, 4 × 4, etc. arrangement or array of lenticules, when projected onto a photosensitive material, depending on the optical system and the scanning system that is used. For example, a discrete square representing a lenticule or an area array can be about 1 centimeter square and will comprise about 200 exposures per side. With an area array of such size, no correction need be made for any image degradation that might occur due to the optical scanning system.

After the master target has been exposed and developed or processed in a manner known to one skilled in the art, the transparency is then placed in an optical system which minifies and projects the pattern of squares on the target onto a photosensitive material in a predetermined and overlapping relation. After processing of the material, the lenticules are evident on the material which can then be used as an element of a rear or front projection type screen. Preferably, the photosensitive material is of a transparent type, that is an emulsion coated on a flexible, transparent support so a sheet of such material can be arranged on and fixed to a drum that is continuously rotated at a predetermined rate. An imaging system, including the target having the array of areas thereon for producing the lenticules, is mounted on a support that is movable axially relative to the drum on which the sheet of material to be exposed is mounted. The imaging system produces a minified image of the area array of the target on the sheet and repetitive exposures are made in conformance with the relative movement of the sheet and the target pattern. The exposure takes place with movement of the target pattern image into a successive and contiguous position relative to the previous exposure in the peripheral direction in which the sheet is moved by the drum and in synchronism with the movement of the image relative to the sheet by a distance equivalent to a part of a row of the array of areas on the target. Timing means responsive to the movement of the sheet and the pattern image, as hereinbefore described, controls the energization of a light source and with repeated exposures of this type, a repetitive and successive sequence of operation is provided, whereby the target image pattern is exposed in overlapping relationship to those images already exposed. After the entire sheet has been so exposed and then developed or processed as set forth in the aforementioned application and publication an array of lenticules having the predetermined profile will be formed on the generally planar emulsion surface of the sheet. The sheet having the array of lenticules, each of which is of the same size and has the same profile, can be used as an element of a front or rear projection screen. The same exposing mechanism can be used to produce a transparency which, in turn, is used to fabricate or produce similar elements by contact printing techniques, in which case the originally produced sheet might be considered as a master sheet.

Other objects and advantages of the invention will become apparent to those skilled in the art from the following description of a preferred embodiment thereof.

DESCRIPTION OF THE DRAWINGS

FIG. 1 is a schematic view showing a typically square lenticule;

FIG. 2 is a typical relief image operating curve for an emulsion that can be used in accordance with the teaching of the invention;

FIG. 3 is a typical lenticule profile based on the exposure factors of the system to be used in producing such a lenticule profile;

FIG. 4 is a diagramatic perspective view of a system showing an arrangement by which a sheet of photosensitive material is exposed to an array of areas carried by a transparent master target;

FIG. 5 is a diagramatic representation of the target area pattern image related to the sheet of photosensitive material and showing the manner in which the image is stepped or moved in two relative directions by the system prior to each exposure of the sheet to the pattern image;

FIG. 6 is a representation of an array of hexagonal areas on a master target and showing the manner in which the sheet of material and the pattern image can be moved relative to one another to effect the contiguous and repetitive exposure of the pattern image so as to produce an element having hexagonal shaped lenticules;

FIG. 7 is a representation similar to FIG. 4 in which a cathode ray tube is utilized as the light source and means for producing the target pattern image.

DESCRIPTION OF THE PREFERRED EMBODIMENT

Figure 8:
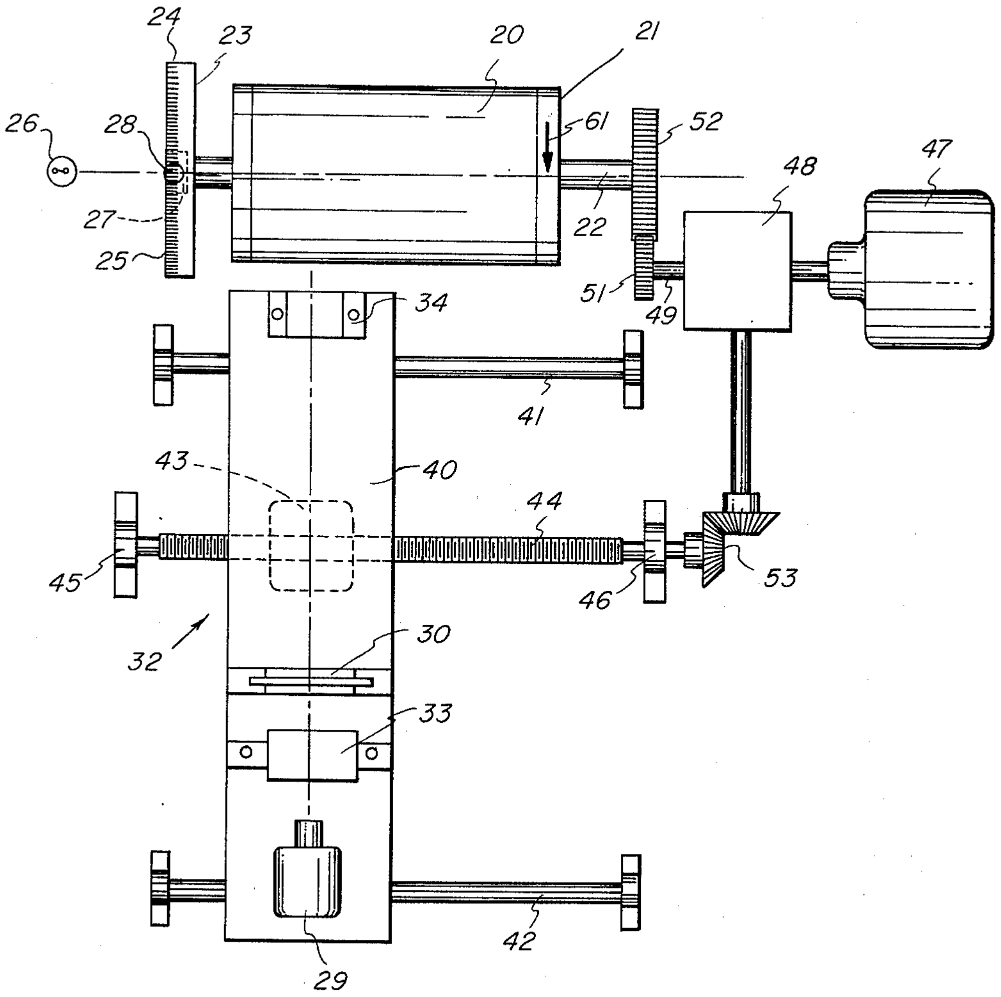
FIG. 8 is a more complete schematic view of the system disclosed in FIG. 4 and showing the manner in which the drives for the sheet of material and the imaging system are interconnected to effect the repetitive and overlapping exposures.

With the computer equipment not available, it is possible to provide exposure profiles on a fine-grained photographic material so that more of the available exposure factors of the material can be utilized. As a result, a lenticule can be obtained whose shape or profile is more nearly exact than has heretofore been possible. As pointed out hereinabove, such an exact or nearly exact profile, as well as the arrangement and location of the lenticules, when provided on the surface of an element for a front or rear projection screen eliminates most, if not all, scintillation. Further, the system to be described hereinafter has the advantage of being able to utilize all or most of the relief image that can be produced by the material. Heretofore, any system utilizing a relief image on film, such as that disclosed in the above-identified application, fails to utilize all and, in most cases, only a fraction of the relief image that can be produced by the photosensitive material. With the method and apparatus about to be described, the resulting range of exposure on a fine-grain photographic material covers most of the exposure factors for such material.

With particular reference to FIG. 1, the outline or square 10 schematically represents the area or boundary covered by a lenticule having that particular shape, that is square or rectangular. By utilizing a procedure as described in the above-identified application and publication, a curve of log relative exposure vs. optical path can be calculated for a section $A_0A'_0$, as shown in FIG. 1. Likewise, a similar curve can be calculated for section $A'_0,A'_5$. If the lenticule is to be symmetrical about the axis $A'_0$, then the aforementioned curves will be identical. If the point $A'_0$ is assumed to represent maximum exposure, it should be adjusted for calculation purposes to lie near the top of the relief image operating curve 11, as shown in FIG. 2. Likewise, the power of the lenticule should be such that point $A_0$ lies no more than about half way down the curve 11. For an elliptically, parabolic lenticule, the total optical path represented by $A_0,A'_0$ plus that represented by $A'_0,A'_5$ should not appreciably exceed the length of the curve 11. Also, the shape of the lenticule can vary and this variation can be in planes perpendicular to the lenticule, as shown by the dotted lines in FIG. 1, or in planes that are radical relative to the axis or point $A'_0$ and perpendicular to the plane of the lenticule or the sheet of material.

A typical curve 12 as calculated for section $A'_0,A'_5$ is shown in FIG. 3. After this curve has been calculated on the basis of a Fourier analysis and the relief image operating curve, it is divided into equal segments along the distance coordinate. Point $A'_5$ is located at a cusp of the curve and and $A'_0$ is located midway between two of them. On the basis of curve 12, the exposure factors can be determined for points $A'_1$, $A'_2$, $A'_3$ and $A'_4$. Likewise, curves similar to that generated for $A_0$,$A'_0$ can be computed for section $A_2,A'_2$ through $A_5,A'_5$, by the same technique. There is now provided a two dimensional array of exposure factors and because of symmetry, these values describe the exposure for a complete lenticule. For practical computation, it may be advisable to compute many more exposure contours than those just described.

Alternatively, using modern high-speed computers, a two dimensional group of values of distance as a function of position in the array can be set up. This group of values can then be processed as needed through the distance-exposure relationship to provide a corresponding group of required exposure factors. The group can comprise several hundred values in each of the two perpendicular directions. In addition, this technique makes it possible to use lenticules other than square, for example, hexagonal. Obtaining the desired exposure distribution on the photographic material can be done in several ways. One method is to image a specially prepared photographic transparency by means of a lens that gives a uniformly high-quality image over the desired lenticule area.

The transparency that is used in the system to be described hereinafter is considered as the master target and comprises an array of very small areas that were exposed in accordance with the exposure factors for the particular emulsion and especially produced by means of a modified version of a commercially available scanner known as a KS Paul Scanner. The light transmission qualities or characteristics of the transparency or master target are such that when the array is imaged in a superposed manner on a photosensitive film mounted on a movable drum, the film, when developed, will have an array of lenticules, each of which will have the desired contour or profile. The master target per se comprises a number of small contiguous areas, each area having a predetermined optical density, and a plurality of such areas being equivalent to a lenticule, and the total number being such as to provide an array equivalent, for example, to a 4 × 4 lenticule array. The minification ratio of the imaging system for the master target is adjusted so that when the target is imaged onto the film the successively exposed images will properly overlap. The axial or lateral rate of movement of the lens-flash lamp-master target assembly relative to the drum is adjusted in a similar manner.

The master target is produced by a system and in much the same manner as described above with respect to the making of a lenticulated film material. In such a system, very small areas or spots on the photosensitive material are exposed as determined by the exposure factors for the photosensitive emulsion. Each exposure of an area or spot is made contiguous to the one previously made and is in accordance with that derived from the exposure factors.

In this respect, the intensity of the light source is controlled by signals derived from a computer tape or similar medium. Each signal is unique for its respective exposure area so that the areas comprising or equivalent to a lenticule will provide the predetermined profile for the lenticule as determined by the exposure factor for the emulsion. Each exposure area in the plurality of such areas comprising a lenticule will, therefore, have a specific exposure in accordance with the selected profile of the lenticule. Consequently, the master target comprises an array of a large number of exposure areas, each of which after development or processing in a manner known to those skilled in the art will have a predetermined optical density. The number of such areas equivalent to an individual lenticule will be contained in an area about 1 centimeter square. Because of the size of each discrete area, no correction need be made for any image degradation that might be attributed to the optical scanner system. After the photosensitive material is exposed and developed, it will then provide a master target comprising an array of areas equivalent in number to a 4 × 4 array of 16 lenticules.

The particular profile of a lenticule can be circular, parabolic or elliptical depending on the desired profile required. As stated hereinbefore, the shape of the lenticule can be utilized to control the light distribution within an audience viewing space when the lenticular element made from the master target is utilized as an element of a front or rear projection screen. Such elements that can be used as a front or rear projection screen element, can be produced as just described or by making contact reproductions from the original element.

An exposure system or apparatus for producing a reduced target is disclosed in FIG. 4. A sheet of photosensitive material that is to be exposed is generally indicated by the numeral 20 and is mounted on a rotatable drum 21. A shaft 22, on which the drum is mounted, also carries a flanged transparent disc 23 which is rotatable therewith. The disc 23 carries a strip of material 24 consisting essentially of uniformly spaced clear lines in an opaque background that is fixed to the peripheral surface of the flange 25 on disc 23. A light source 26 and a mirror 27 are utilized to illuminate the clear lines which are incident on a photosensor 28. The photosensor 28 is interconnected to a flash lamp 29 for intermittently energizing the lamp in accordance with the signals generated by each clear line image derived from the strip 24 on the disc 23. A processed transparent master target 30 comprising a number of areas to provide the equivalent of a 4 × 4 array of lenticules as described hereinabove, is designated by the numeral 31. The target is arranged in an imaging system 32 of which lenses 33 and 34 are a part. The lens 33 has an exit pupil with an area sufficient to include the total area of the master target 30; hence, the full array of areas of various optical densities. It was found that if lens 33 is an f/1.6 lens with a focal length of 100 mm, such a lens would have an adequate aperture to completely cover master target 30.

The arc of the flash lamp 29 is imaged into the aperture of lens 34. In order to maintain uniform illumination on the photosensitive material 20, the complete imaging system or unit 32 consisting of the flash lamp 29, lens 33, master target 30, and lens 34 is moved by a lead screw mechanism to be more fully described hereinafter. Lens 34 can have a focal length of about 75 mm and can be used with an f/8 aperture. At this aperture the lens quality should be very good near the axis. The optical reduction by lens 34 is such that an array of areas corresponding to a lenticule can be approximately 2 mm square. By this exposing procedure, reduced target array 30' can be made arbitrarily large.

The strip of film 24 that is mounted on the flange 25 of disc 23 can be produced by the above described scanning system. The flash lamp 29, lens 33 and transparency target 30 are removed from the system and a single illuminated slit mounted some distance away is imaged by lens 34 onto a sheet of photosensitive material mounted on the drum 21. By scanning over the peripheral length of the photosensitive material, a series of lines are generated. The rate of scan can be adjusted to give the desired line spacing. After the material has been exposed, it can be photographically processed and printed onto a high-contrast film to give narrow clear lines on an opaque background. The film strip 24 can then be adhered to or fastened in any well known manner to the peripheral surface of the flange 25 on disc 23.

An exposure system or apparatus for producing a lenticulated element is disclosed in FIG. 8. The flash lamp 29, lens 33, processed, reduced target 30' and lens 34 are mounted on a plate 40 which is slidably mounted and movable along spaced rods 41 and 42. The plate 40 carries a fixed nut 43 which engages a lead screw 44 that is rotatably mounted in spaced bearings 45 and 46. A motor 47 is interconnected to a gear box 48 which has an output shaft 49 for imparting rotary movement to the drum 21 and an output shaft 50 for rotating the lead screw 44, thereby moving the plate 40. The shaft 49 is interconnected to shaft 22 by gears 51 and 52 and the shaft 50 is interconnected to the lead screw 44 by means of a set of bevel gears 53. The gear box 48 can be provided with a suitable mechanism by which the relative rates of rotation of the shaft 22 and the lead screw 44 can be adjusted relative to one another, within certain limits, to obtain the necessary and desired rates of synchronous movement. With this arrangement, the drum 21 is rotated at a predetermined rate and, at the same time, the imaging system 32 is moved axially as a unit relative to the drum 21 and in synchronism therewith.

With particular reference to FIG. 5, there is shown an array pattern indicated by the numeral 60 which comprises a number of exposure areas which will provide a 4 × 4 arrangement of lenticules which are designated by 60-1, 60-2, etc. The array pattern 60 is representative of the image of the master target 30 that is exposed on the photosensitive material 20. It should be noted that heavy lines are used only to indicate the equivalent lenticule, also as in FIG. 4, and do not appear as such in the actual target or image. It will be noted that as the drum 21 is rotated in a direction indicated by the arrow 61, each subsequent exposure takes place when the image is moved a distance equal to the width of a lenticule. At the same time, the image will be displaced laterally (axially relative to the axis of drum 10) as shown in exaggerated form in FIG. 4, which for practical purposes is relatively insignificant. As a result, repetitive exposures are made each time the pattern 60 is moved in one direction so that the lenticule areas are superposed with respect to those last exposed. When the drum 21 is rotated on complete revolution, the pattern will be moved laterally a distance equal to the lenticule width. This series of exposures with continuous movement and displacement of the material relative to the image pattern 60 results in multiple or superimposed exposures of each area. The exposures are repetitive and consecutive relative to the displacement of the photosensitive material so that an overlapping relationship of the image pattern 60 equivalent to one lenticule is obtained with essentially each revolution of the drum 21. The exposure duration is so short that the type of flash lamp required by the system is one that must have an extraordinary life relative to the number of exposures that can be made; hence, the need for overlapping or multiple exposures is necessitated by the number required and the type of flash lamp available for making such a large number of successive exposures at very small time intervals.

After the photosensitive material 20 has been photographically processed, it is then mounted relative to a fine-grain plate which is then illuminated for exposing the array of lenticules onto the plate. The plate so exposed is then photographically processed and can be utilized as an element of a front or rear projection screen. On the other hand, if the photosensitive material 20 is not to be used as a master for producing plates having the same array of lenticules, then the photosensitive material per se can be used as a screen element or can be mounted on a transparent support to provide or form such a screen per se. Each lenticule on the material 20 or the plate will have a maximum exposure at its center with the exposure decreasing in all directions toward the edges.

With particular reference to FIG. 6, the method described above can be utilized to produce a hexagonally packed array 65 by using an appropriate master target that is produced in a manner similar to that already described. Such a hexagonal array can be produced by utilizing the system disclosed in FIGS. 4 and 8. The advance of the lead screw 44, as shown in FIG. 8, should correspond to the distance ΔW while the spacing between successive exposure flashes should correspond to the distance $\Delta h$. If the master target is rotated by 90°, the screw advance corresponds to the distance ΔH while the distance between flashes corresponds to ΔW. In either case, the value ΔW can be one half as large as shown, providing that for every one-half ΔW in the orthognal direction, the target image pattern is shifted ½ $\Delta h$ in that same direction.

The master target for making an array of hexagonal lenticules is also based on an orthognal array of areas because of the nature of the scanner. It is necessary that the array of areas equivalent to a lenticule contain at least one every area comprising the hexagonal lenticule that cannot be found some other place in the lenticule because of the threefold symmetry of a hexagon. The array of areas used for one lenticule can, however, contain more areas than are required for one complete hexagonal lenticule, or even a large number of complete hexagonal lenticules. The overall array of areas always will contain more areas than required, but any excess can be ignored in setting up the scanner.

A method for producing a lenticulated pattern somewhat different from that shown in FIGS. 4 and 8 is disclosed in FIG. 7. Instead of forming an image of a photographic master target as described above, an equivalent image is formed by a cathode ray tube 68. As in the system described hereinabove, the drum 21 is continuously rotated and the photosensitive material 20 is secured thereto for rotation therewith. Also, the lens 69 is moved by a lead screw not shown in a manner as described with respect to FIG. 8. If the area images on the photosensitive material 20 are being made at the actual lenticule size, the lens 69 moves a distance equal to the lenticule spacing or center-to-center distance with each revolution of the drum 21. The cathode ray tube 68 may or may not move parallel to and with the lens 69.

With reference to FIG. 7, a sweep generator 70 produces a high frequency sawtooth voltage signal which is fed to the Y axis sweep of the cathode ray tube 68. This same signal is also fed into a memory unit 71. The memory 71 serves to produce digital signals corresponding to the contour of one or more lenticules. Specifically, this contour is the recombining of the Fourier components of the desired parabolic contour divided by the frequency response coefficients of the relief image of the material used to form the lenticules. The digital data from memory unit 71 is fed into a digital to analog converter 72 which provides a voltage signal corresponding to the modified parabolic contour. Ignoring the summing unit 73 for the moment, the signal from the converter 72 passes into the shaping unit 74 which compensates for the exposure factors of the material (emulsion) for forming the relief image. This signal then passes to the cathode ray tube 68 (X axis) and modulates the intensity of the spot as it scans across the tube. The shaping unit 73 can also be used to compensate for monlinearities between input voltage and output spot intensity. Likewise, it can further compensate for the H and D curves of the material (emulsion) on the drum 21 if this material is used for contact printing onto a material on which the desired relief images are to be formed.

As the drum 21 rotates, it carries with it a shaft encoder, designated by the numeral 75, which produces a signal that is fed to another memory unit 76. This latter memory unit produces a digital signal corresponding to the modified lenticule contour in the direction relative to the rotation of the drum 21. This digital signal is converted by the converter circuit 77 to an analog voltage which is summed with the signal derived from converter 72. This provides a modulation of the line sweep intensity of the cathode ray tube 68, such that proper exposure modulation is produced along the scanning direction.

The system as described does not provide correction for the MTF of the lens. For the direction along the length of the drum 21, a nonphase-shifting electrical filter for boosting high frequencies can be inserted between the shaping circuit 74 and the cathode ray tube 68. Compensation can also be made for both directions by ignoring nonlinearities and including it with the data from the memory units 71 and 76.

From the foregoing description it should be evident that a photographically prepared master target comprising an array of areas of different optical density can be exposed by a scanner on a sheet of photosensitive material to fully utilize the sensitometric characteristics of the particular photographic material being used. It has been found that the speckle and scintillation normally generated by the light incident on a screen, whether of the front or rear projection type, will for the most part be eliminated when a lenticular material made as described hereinabove is used as an element of such screen. Alleviation of speckle and scintillation is due in the main to the lack of irregularities in the size, shape, form, etc. of the lenticules per se and the uniformity in spacing of lenticules relative to one another.

This invention has been described in detail with particular reference to preferred embodiments thereof but it will be understood that variations and modifications can be effected within the spirit and scope of the invention.

We claim:

1. A method for photographically producing a transparent master target for use in making a transparent screen element having an array of discrete, contiguous lenticules each of which has the same predetermined profile, the master target being a photosensitive material comprising a transparent support having at least one layer of a photographic emulsion on a surface thereof, comprising the steps of:

determining an exposure intensity from the exposure factors for the emulsion on the photosensitive material with respect to each of a number of discrete, contiguous areas forming a pattern of areas corresponding to the size of a lenticule for producing the predetermined profile;

moving the photosensitive material intermittently in X-Y mutually perpendicular directions to position each discrete area relative to a source of illumination;

exposing each discrete area, while the photosensitive material is stationary, to the source of illumination in accordance with the established exposure intensity for the respective discrete area; and processing the photosensitive material, whereby each discrete area has an optical density related to a corresponding portion of the predetermined profile of the lenticule.

2. The method in accordance with claim 1 wherein the source of illumination produces a beam of light equivalent generally in size and shape to that of a discrete area.

3. The method in accordance with claim 2 wherein the established exposure intensity for each discrete area is inversely related to the corresponding portion of the predetermined profile of the lenticule.

4. A method of exposing a photosensitive material having predetermined exposure factors in a repetitive and overlapping sequence to a transparent master target, the target having at least one pattern comprising a plurality of discrete, contiguous areas, each of which has an optical density related to the exposure factors of the material, for producing, upon processing of the material, an array of discrete, contiguous lenticules each of which has the same predetermined profile, comprising the steps of:

moving the material continuously in one direction at a generally uniform rate;

moving continuously an imaging system including a source of illumination, the transparent master target, and a lens system for projecting a minified image of the pattern of areas on the material in an other direction at a generally uniform rate in synchronism with and normal to the movement of the material in the one direction, the rate of movement of the imaging system being less than that of the material;

triggering the source of illumination in timed relation to the movement of the material so as to expose the material to successive contiguous images of the pattern of areas in the one direction, each exposure of an image of the pattern of areas being displaced in the other direction by a distance generally equivalent to one of the areas; and repeating the triggering step for a number of times equivalent to the number of areas comprising one dimension of the pattern of areas, after which, overlapping exposure of the material to the pattern of areas will occur with continued repetition of the triggering step.

5. The method in accordance with claim 4 wherein the photosensitive material comprises a transparent support having a photosensitive emulsion applied to a surface thereof and the exposure factors are related to the emulsion.

6. The method in accordance with claim 4 including the step of processing the material whereby an array of discrete, contiguous lenticules is formed, each lenticule being of the same general size and shape and generally having the same predetermined profile.

7. The method in accordance with claim 6 wherein the triggering step occurs repetitively after the material has been moved in the one direction a distance generally equivalent to that of the minified image of the pattern of areas in the one direction and the imaging system has been moved in the other direction a distance generally equivalent to the minified image size of a discrete area.

* * * * *